(12) United States Patent
Suenaga et al.

(10) Patent No.: US 6,448,636 B2
(45) Date of Patent: *Sep. 10, 2002

(54) MULTI-LAYERED INTEGRATED SEMICONDUCTOR DEVICE INCORPORATING ELECTRICALLY CONNECTED INTEGRATED CIRCUIT CHIPS AND MONITORING PADS

(75) Inventors: Yoshiaki Suenaga; Tatsuo Kishino, both of Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/520,312

(22) Filed: Mar. 7, 2000

(30) Foreign Application Priority Data

Mar. 9, 1999 (JP) .......................................... 11-060957

(51) Int. Cl.[7] .............................................. H01L 23/48
(52) U.S. Cl. ...................... 257/678; 257/723; 257/724; 257/784; 257/777
(58) Field of Search ................. 257/786, 723, 257/724, 48; 438/666, 18

(56) References Cited

U.S. PATENT DOCUMENTS

| | | | | |
|---|---|---|---|---|
| 5,594,273 A | * | 1/1997 | Dasse et al. ................. | 257/620 |
| 5,619,462 A | * | 4/1997 | McClure ........................ | 257/48 |
| 5,648,661 A | * | 7/1997 | Rostoker et al. ............... | 257/48 |
| 5,654,588 A | * | 8/1997 | Dasse et al. .................. | 257/754 |
| 5,708,296 A | * | 1/1998 | Masayuki et al. ........... | 257/723 |
| 5,708,298 A | * | 1/1998 | Masayuki et al. ........... | 257/723 |
| 5,910,685 A | * | 6/1999 | Watanabe et al. ............ | 257/777 |
| 5,965,902 A | * | 10/1999 | Beffa ............................ | 257/48 |
| 5,982,042 A | * | 11/1999 | Nakamura ................... | 257/786 |
| 5,986,282 A | * | 11/1999 | Seki .............................. | 257/48 |
| 6,028,324 A | * | 2/2000 | Su et al. ........................ | 257/48 |
| 6,054,754 A | * | 4/2000 | Bissey ........................... | 257/666 |
| 6,078,514 A | * | 6/2000 | Takemae et al. .............. | 365/63 |

* cited by examiner

Primary Examiner—Jerome Jackson
Assistant Examiner—Lourdes Cruz
(74) Attorney, Agent, or Firm—Hogan & Hartson, LLP

(57) ABSTRACT

A multi-layered integrated semiconductor device incorporates an upper and lower IC chips which are connected with each other via a first set of wiring pads of the upper IC chip to a second set of wiring pads of the lower IC chip. The device is provided with a multiplicity of pair-wise connected external monitoring terminals on the periphery of the upper IC chip, and a multiplicity of monitoring pads on the lower IC chip, in opposition to the pair-wise connected monitoring pads, so that pad-to-pad resistances between the pads of the upper and lower IC chips can be externally measured by directly connecting the monitoring pads to the external terminals.

9 Claims, 5 Drawing Sheets

MULTI-LAYERED INTEGRATED SEMICONDUCTOR DEVICE INCORPORATING ELECTRICALLY CONNECTED INTEGRATED CIRCUIT CHIPS AND MONITORING PADS

FIELD OF THE INVENTION

The invention relates to a multi-layered integrated semiconductor device incorporating a multiplicity of electrically connected integrated circuit (IC) chips.

BACKGROUND OF THE INVENTION

A new type of multi-layered integrated semiconductor devices have been developed which incorporate one IC chip electrically connected to another IC chip. FIG. 6 shows such a multi-layered integrated semiconductor device as mentioned above.

As seen in FIG. 6, a first semiconductor IC chip 610 includes a multiplicity of wiring pads 640 on which protruding electrodes or bumps 650 are formed. A second integrated semiconductor IC chip 620 also includes a multiplicity of wiring pads 660 which face corresponding wiring pads 640 of the first IC chip, on which protruding electrodes or bumps 670 are formed to oppose the bumps 650. Disposed between the first and the second IC chips 610 and 620, respectively, is an adhesive anisotropic conductive plastic layer 630 which contains electrically conductive particles dispersed throughout the plastic layer.

The anisotropic conductive layer 630 in contact with the first and the second IC chips 610 and 620, respectively, is thermocompressed between them. Since portions of the anisotropic conductive layer 630 thus compressed by the bumps 650 and 670 of the first and the second IC chips, respectively, become electrically conductive, electric connections are established between each pair of facing bumps 650 and 670.

Thus, necessary electric connections can be obtained simultaneously for the wiring pads of the first and the second IC chips.

The multi-layered integrated IC device 600 of the first and the second semiconductor IC chips 610 and 620 is then wire bonded, by means of wires W, to the wiring pads 680 and external lead terminals T formed on the periphery of the second IC chip 620, followed by encapsulation by a plastic, thereby forming a single package of the multi-layered integrated IC chips.

Advantageously, this integration technique, often called chip-on-chip technique, requires no wire bonding in packaging two IC chips into a multi-layered integrated IC device 600, so that it can be done quickly and permit minimization of the integrated IC device.

However, in such multi-layered integrated IC devices integrated by chip-on-chip technique, wiring pads (including the bumps thereof if used) of the upper or first IC chip 610 are connected to the associated wiring pads of the lower or second IC chip 620, and electrically connected to external terminals T through internal gates of the second IC chip 620.

Consequently, it is impossible to measure pad-to-pad resistances between the corresponding wiring pads of the upper and the lower IC chips 610 and 620, respectively. As a result, quality tests to remove faulty products is difficult to do, and so is provision of a guarantee for the products.

SUMMARY OF THE INVENTION

The invention is directed to a multi-layered integrated semiconductor IC device incorporating a first and a second IC chips connected with each other via a first and a second sets of wiring pads of the first and the second IC chip, respectively, such that pad-to-pad resistances between the associated wiring pads can be externally measured by means of an external measurement device, thereby increasing the reliability of the wiring pad connections.

In one aspect of the invention, there is provided a multi-layered integrated semiconductor device incorporating a first and a second IC chips which are connected with each other via a first set of wiring pads of the first IC chip to a second set of wiring pads of the second IC chip each formed in opposition to a corresponding wiring pad of the first IC chip, the integrated semiconductor device comprising:

a first set of distributed monitoring pads formed on said first IC chip, said monitoring pads connected in pairs;

a second set of monitoring pads each formed on the second IC chip, in opposition to an associated one of said first monitoring pads; and a multiplicity of external monitoring terminals each formed on said semiconductor device and connected to an associated one of said second monitoring pads, thereby allowing measurements of pad-to-pad resistances between corresponding monitoring pads of said first and second IC chips using an associated pair of said external monitoring terminals connected to said corresponding pads.

Since the integrated chip has a feature that the pad-to-pad resistances between the wiring pads of the first and the second semiconductor IC chips can be measured directly via the external terminals, they can be tested and removed if it has a faulty connection even after the upper and the lower IC chips are integrated, thereby providing a greater reliability of the products.

The pair-wise connected first monitoring pads are preferably formed at the periphery of the first IC chip, so that the wiring pads may be securely formed well on the monitoring pads and have less resistances than the pad-to-pad resistances of the monitoring pads.

The pair-wise connected first monitoring pads may alternatively be disposed at the four corners of the first IC chip.

In this case, the pad-to-pad resistance of a given pair of the wiring pads of the first and the second IC chips can be obtained accurately from the measurements using the four-cornered terminals, because the measured values are proportional to the distances from the four-cornered terminals to the pair. Since the integrated semiconductor device is materially hard and non-deformable, such measurement of pad-to-pad resistances of the wiring pads will not be appreciably affected by the deformation if the measurements are performed at the four corners.

It would be understood that one of the pair-wise connected monitoring pads may substitute for the associated wiring pad of the first IC chip, thereby reducing the number and cost of the monitoring pads and external monitoring terminals for the monitoring pads.

In another aspect of the invention, there is provided a multi-layered integrated semiconductor device incorporating a first and a second IC chips which are connected with each other, said integrated semiconductor device comprising:

a first power supply pad formed on said first IC chip and connected to a power supply line;

a first grounding pad formed on said first IC chip and connected to a ground line;

a first set of wiring pads formed on said first IC chip and connected via diodes to said power supply line. and ground line and said first IC chip;

a second power supply pad formed on said second IC chip in opposition to said first power supply pad;

a second grounding pad formed on said second IC chip in opposition to said first grounding pad;

a second set of wiring pads formed on said second IC chip, in opposition to the respective wiring pads of said first IC chip;

a multiplicity of switchable connection circuits formed on said second IC chip for selectively connecting said second wiring pads to either said second IC chip or an external test signal line;

an external power supply pad connected to said second power supply pad;

an external grounding terminal connected to said second grounding pad; and a multiplicity of external test terminals connectable to said external test signal line.

This arrangement enables measurement of pad-to-pad resistances of the first and second wiring pads by means of the external test terminals, the power supply terminals, and the grounding terminals.

That is, a pad-to-pad resistance of a particular pair of the first and second wiring pad of interest can be directly measured using the power supply terminal connected to the test terminal or power supply pad, and the grounding pad connected to the wiring pad, by selectively connecting an appropriate test terminal to the wiring pad of the second IC chip by means of the switchable connection circuits. Such measurements enables detection and elimination of faulty products to guarantee required quality of the products.

It should be noted that no structural modification or addition of elements is needed for the first IC chip in carrying out the invention if it is a conventional IC chip.

It should be also noted that an adequate measurement of an individual pad-to-pad resistance can be performed using an external terminal.

In a further aspect of the invention, there is provided a multi-layered integrated semiconductor device incorporating a first and a second IC chips which are connected with each other, said integrated semiconductor device comprising:

a first power supply pad formed on said first IC chip and connected to a power supply line;

a first grounding pad formed on said first IC chip and connected to a ground line;

a first set of wiring pads formed on said first IC chip and connected via diodes to said power supply line and ground line and said first IC chip;

a second power supply pad formed on said second IC chip in opposition to said first power supply pad;

a second grounding pad formed on said second IC chip in opposition to said first grounding pad;

a second set of wiring pads formed on said second IC chip, in opposition to the respective wiring pads of said first IC chip;

a multiplicity of buffer circuits formed on said second IC chip for selectively connecting to/disconnecting from said second IC chip said second wiring pads;

an external power supply terminal connected to said second power supply pad;

an external grounding terminal connected to said second grounding pad; and a multiplicity of external test terminals connectable to said second wiring pads.

This arrangement also enables measurements of pad-to-pad resistances of the first and second wiring pads by means of the external test terminals, the power supply terminal, and the grounding terminals.

In this arrangement, individual pad-to-pad resistances of the first and the second wiring pads can be measured directly from the voltage across an external monitoring terminal connected to the second wiring pads and an external terminal connected to the power supply pad. Such measurement enables detection and elimination of faulty products to guarantee required product quality.

It should be noted that no structural modification or no additional element is needed for the first IC chip in carrying out the invention, so that any conventional IC chip can be used as it is.

It should be also noted that, in this arrangement, pad-to-pad resistances of the wiring pads, especially four-cornered wiring pads, can be directly and individually evaluated adequately using the external terminals but not using analog switches.

BRIEF DESCRIPTION OF THE DRAWINGS

The invention will now be described in detail by way of example with reference to accompanying drawings, in which.

DETAILED DESCRIPTION OF THE PREFERRED EMBODIMENT

Figure 1:
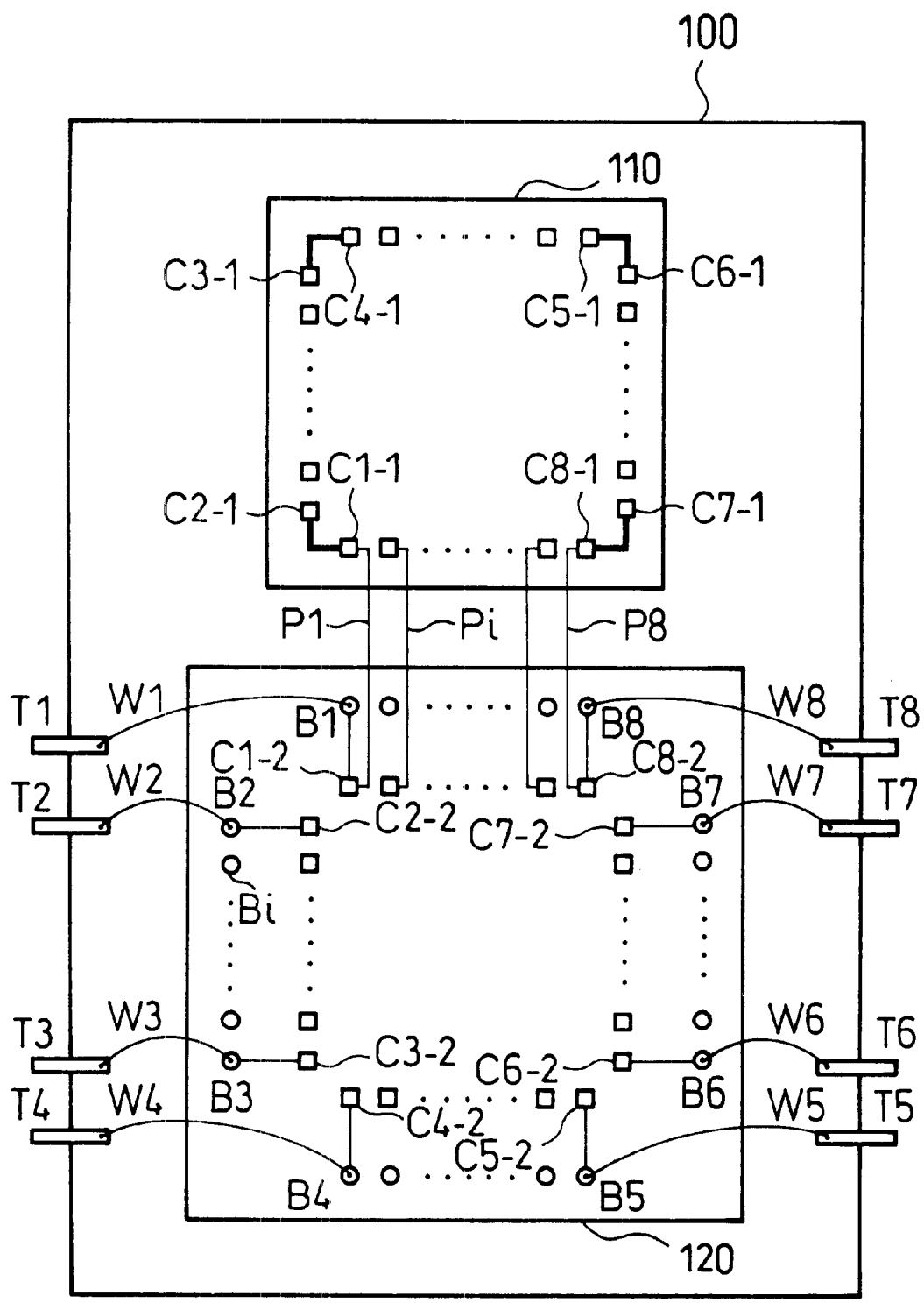
FIG. 1 is a block diagram of a first semiconductor device according to the invention.

FIG. 1 is a schematic representation of a first integrated semiconductor device according to the invention, showing the structure thereof in development for ease of understanding of the invention.

Referring to FIG. 1, there is shown a first semiconductor device 110 having four cornered monitoring pads C1-1 through C8-1 plus ordinary wiring pads. As shown in FIG. 1, a monitoring pad C1-1 is directly connected with a pad C2-1, a monitoring pad C3-1 with a pad C4-1, a pad C5-1 with a pad C6-1, and a pad C7-1 with a pad C8-1. A second IC chip 120 also has monitoring pads C1-2 through C8-2 in addition to ordinary wiring pads, all located in opposition to the corresponding monitoring pads C1-1 through C8-1.

The monitoring pads C1-2 through C8-2 are directly connected to respective wiring pads B1–B8 formed at the periphery of the second semiconductor IC chip 120, which wiring pads B1–B8 are in turn bonded to external terminals T1–T8 by respective wires W1–W8.

It is noted that other wiring pads formed at the periphery of the second IC chip 120, wire bonded to the respective external terminals T1–T8, are normally joined to internal elements of the circuit 120.

The first IC chip 110 is aligned in position with the second IC chip 120 and overlaid on an anisotropic conductive layer lying on the second IC chip 120, thereby sandwiching the anisotropic conductive layer between the first and the second IC chip. The anisotropic conductive layer is then thermocompressed by the IC chips so as to form electric connections between the corresponding wiring pads of the first and the second IC chip 110 and 120, respectively. For example, the monitoring pads C1-1 and C1-2 are connected with each other by a section P1 of the anisotropic conductive layer, and the monitoring pads C8-1 and C8-2 are connected with each other by a section P8 of the anisotropic conductive layer. Other wiring pads are similarly connected.

The pad-to-pad resistances of these wiring pads of the first and the second IC chips 110 and 120, respectively incorporated in the integrated semiconductor device 100 can be measured as follows.

First, in order to calculate a pad-to-pad resistance, a predetermined voltage is applied across the external terminals T1 and T2 associated with the pads, and the electric current through them is measured. The path between the external terminal T1 and the terminal T2 includes only metal leads and the anisotropic conductive layer between the first and the second IC chips, so that the resistance of the path can be accurately measured to the order of a few milli-ohms.

Next, similar measurements are performed for the rest of the paths between the external terminals T3 and T4, T5 and T6, and, T7 and T8.

The pad-to-pad resistance of pads located at an inner position of the IC chips can be calculated from the measurements made by the four cornered terminals, assuming that a pad-to-pad resistance is proportional to the distance from the four corners to that pad-pad pair. The pad-to-pad resistances are substantially free of errors caused by the deformation of the chip during the measurements since the semiconductor IC chips are hard and non-deformable. The four corner measurements would provide sufficient information as to connection failures of the wiring pads.

In the example shown above, a total of 8 monitoring pads C1-1 through C8-1 of the first IC chip 110, a total of 8 monitoring pads C1-2 through C8-2 of the second IC chips 120, a total of 8 wiring pads B1–B8 and a total of 8 external terminals T1 through T8 are formed in pairs, with one pair located at each corner, as shown in FIG. 1. However, one member of each pair of these pads/terminals may be substituted for by a wiring pad of the second IC chip 120 connected to a power supply, a ground line, and other external terminals, and by corresponding wiring pads of the first IC chip 110. It should be apparent that the remaining monitoring pad of each pair is directly connected with the respective substituting wiring pad (e.g. C1-1) of the first IC chip 110.

In this manner, if conventional wiring pads are utilized as monitoring pads, the numbers of the monitoring pads (C1-1–C8-1) for the first IC chip 110, the monitoring pads (C1-2–C8-2) for the second IC chip 120, connection pads (B1–B8) for connection with the external terminals, and the external terminals (T1–T8) can be reduced to one half.

In the example shown herein above, the monitoring pads are located at the four corners. However, they can be located at any convenient symmetric positions, near the periphery of the IC chips for example, so long as the geometrical factor of the monitoring pads may be annihilated.

In the embodiment shown above, the pad-to-pad resistances of the wiring pads can be measured with a high precision, which helps select faulty products having poor connections and maintain a higher quality of the products.

Figure 2:
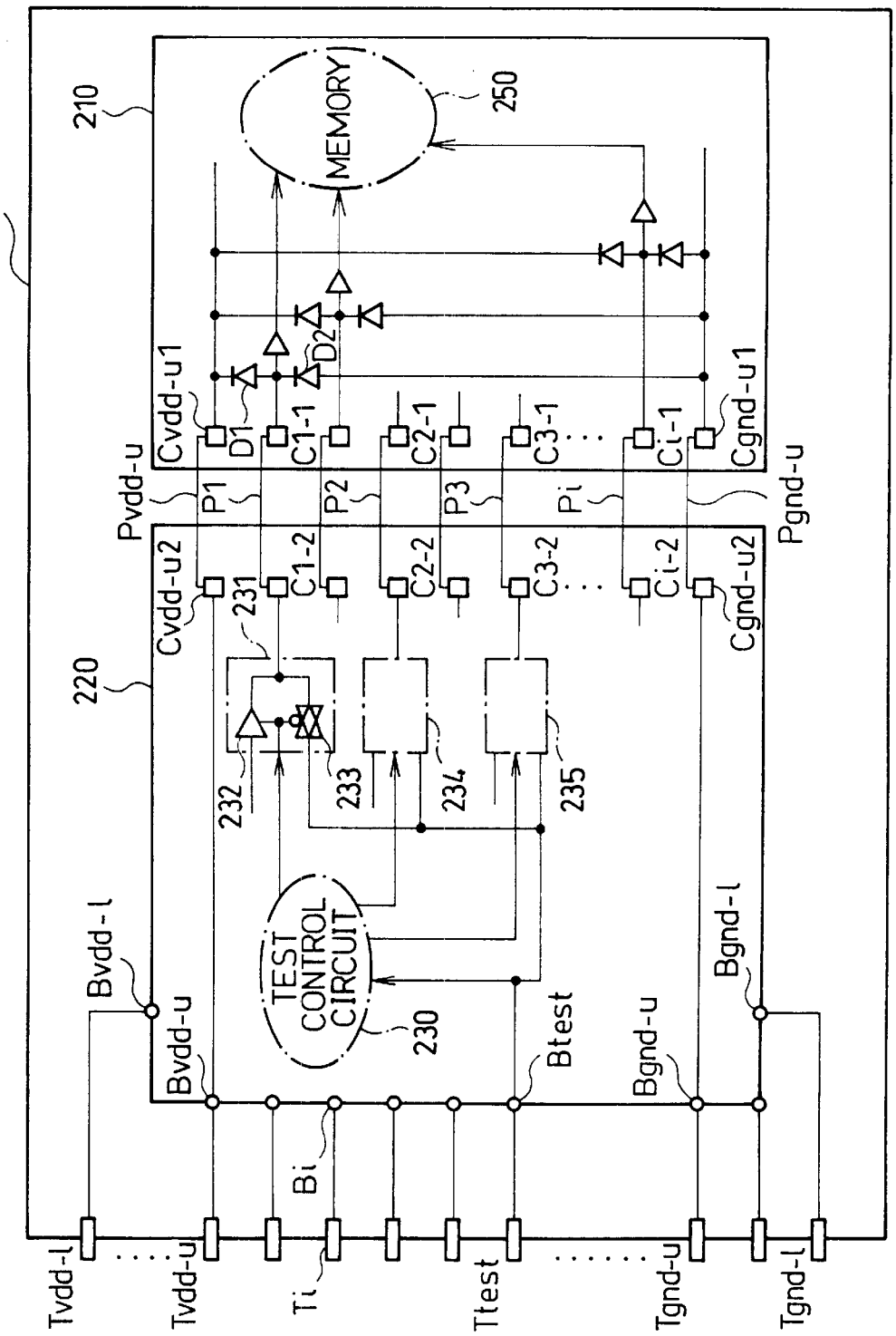
FIG. 2 is a block diagram of a second semiconductor device according to the invention.

FIG. 2 is a schematic representation of a second integrated semiconductor device according to the invention, showing the structure thereof in development for ease of understanding of the invention.

The first IC chip 210 of FIG. 2 is a general purpose IC chip (such as a memory IC having a memory device 250) including diodes D1 and D2 serving as standard protective elements against electrostatic hazards. Each of I/O wiring pads C1-1–C3-1 are connected to a positive power supply via the diode D1, and to a negative voltage supply via the diode D2. The diodes D1 and D2 are capable of suppressing an anomalous voltage surge appearing at the I/O wiring pads by causing the negative voltage supply to absorb the anomalous voltage surge.

On the other hand, the second IC chip 220 is provided with a power supply pad Cvdd-u2 and a grounding pad Cgnd-u2 in opposition to a power supply pad Cvdd-u1 and a grounding pad Cgnd-u1, respectively, of the first IC chip 210, in addition to ordinary wiring pads formed in opposition to the corresponding wiring pads of the first IC chip 210. The power supply pad Cvdd-u2 is connected to an external terminal Tvdd-u via an external wiring pad Bvdd-u of the second IC chip 220. The grounding pad Cgnd-u2 is connected to an external terminal Tgnd-u via an external wiring pad Bgnd-u of the second IC chip 220.

A power line of the second IC chip 220 is connected to an external terminal Tvdd-1 via an external wiring pad Bvdd-1, and to an external terminal Tgnd-1 via an external connection pad Bgnd-1. That is, the power line and the ground line of the first IC chip 210 are formed independent of the power line and the ground line of the second IC chip 220.

The wiring pads C1-2–C3-2 are connected with switchable connection circuits 231, 234, and 235, respectively, each having a buffer circuit 232. and an analog switch 233. The buffer circuit 232 and the analog switch 233 can be switchably connected to the associated wiring pads of the first IC chip 210 in normal operation and in the connection test, respectively. When a test instruction is received from a test control circuit 230, one of the analog switches 233 of the switchable connection circuits is turned ON, so that the corresponding one of the wiring pads C1-2–C3-1 is selectively connected to an external test terminal Ttest via a test signal line and a wiring pad Btest.

The first IC chip 210, aligned with the second IC chip 220, is overlaid on an isotropic conductive layer placed on the second IC chip 220. When the sandwiched conductive layer is thermocompressed, it becomes electrically conductive, thereby connecting the corresponding wiring pads of the first and the second IC chips. For example, the wiring pads C1-1 and C1-2 are electrically connected with each other by a section P1 of the anisotropic conductive layer while the power supply pads Cvdd-u1 and Cvdd-u2 are electrically connected with each other by a section Pvdd-u of the anisotropic conductive layer. Similar connections are formed between other corresponding wiring pads.

Electric connections of the wiring pads of the integrated semiconductor device 200 thus assembled are tested and confirmed as follows.

First, the test control circuit 230 is controlled by a control signal received via the test terminal Ttest or from an external terminal so that the output of the control circuit 230 turns on/off an appropriate analog switch 233 belonging to the switchable connection circuit associated with the wiring pads to be tested.

Figure 3:
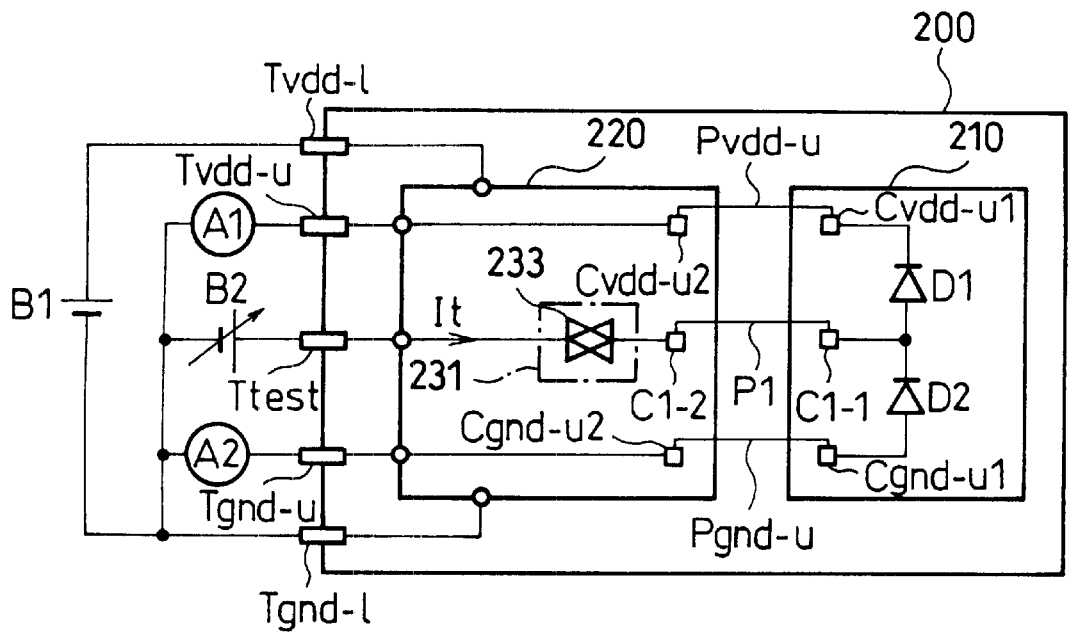
FIG. 3 is a block diagram showing circuitry connections for a pad-to-pad resistance measurement.
Figure 4:
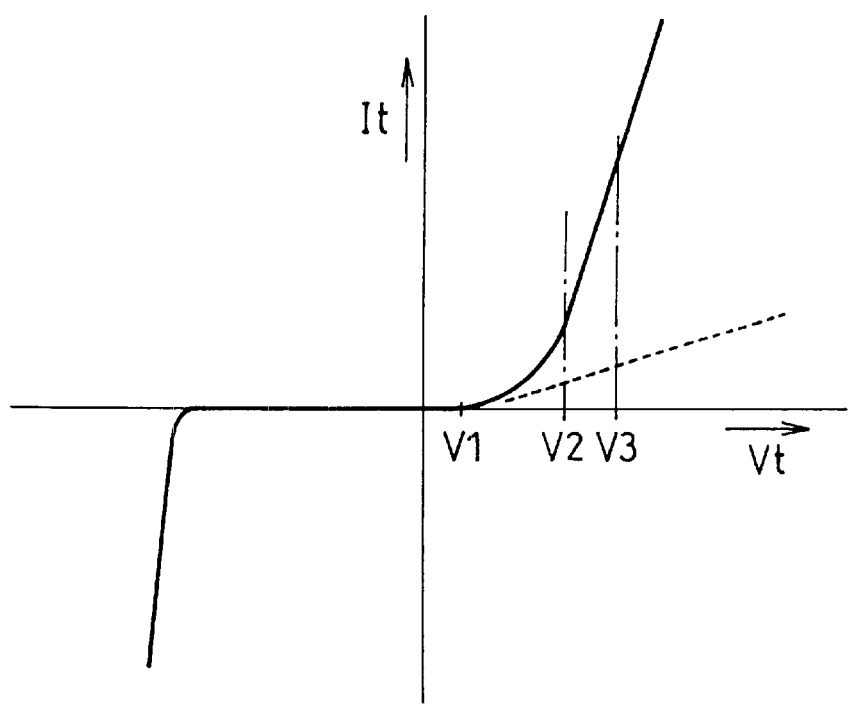
FIG. 4 is a graphical representation of voltage-current characteristic of the second semiconductor device.

Referring to FIGS. 3 and 4, a procedure of measuring a pad-to-pad resistance of the integrated semiconductor device 200 will now be described. FIG. 3 illustrates a measurement of a pad-to-pad resistance between the wiring pad C1-1 and C1-2 by turning on the analog switch 233 of the switchable connection circuit 231. FIG. 4 shows a typical voltage-current characteristic of a pad-to-pad connection. The ordinate and the abscissa represent the voltage applied across the pads and the current through it, respectively.

As shown in FIG. 3, a variable voltage source B2 is connected to the external test terminal Ttest, and to the external power supply terminal Tvdd-u and the external grounding terminal Tgnd-u via amperemeters A1 and A2, respectively. Under the condition shown in FIG. 3, an electric current flows from the variable power supply B2 to the analog switch 233, and through the wiring pad C1-2, the section P1 of the anisotropic conductive layer, the wiring pad C1-1, the diode D1, the power supply pad Cvdd-u1, the section Pvdd-u of the anisotropic conductive layer, and the power supply pad Cvdd-u2. The current through the path is measured by the amperemeter A1. The resistance of the path may be determined from the voltage of the variable power supply B2 and the current read on the amperemeter A1.

The resistances of the analog switch 233 and the diodes D1 and D2 may be measured in advance. Hence, the resistances of the rest of the elements in the path may be determined from the measurement.

The diodes D1 and D2 have a nonlinear voltage-current characteristic as shown by a solid curve in FIG. 4. Thus, by varying the output voltage of the variable voltage power supply B2 to v1, v2, v3, etc. in sequence, and by measuring the currents through the path for the varied voltages, detailed connecting conditions of the pads may be obtained. If some connection failure occurs in one element or other in the path, the characteristic curve will become a broken line as shown in FIG. 4, which enables one to discern the connection failure.

Next, if the polarity of the variable power supply B2 of FIG. 3 is reversed, the current from the power supply B2 flows from the grounding pad Cgnd-u2 to the section Pgnd-u of the anisotropic conductive layer, and further through the grounding pad Cgnd-u1, the diode D2, the wiring pads C1-1, the section P1 of the anisotropic conductive layer, the wiring pads C1-2, and the analog switch 233. This current can be measured by the amperemeter A2. From the voltage of the power supply B2 and the current measured by the amperemeter A2, the total resistance of the path is obtained.

In this manner, an exhaustive measurements of the resistance can be done easily and precisely in two ways by changing the polarity of the power supply to find any connection failure that may exist.

Following the measurement for the wiring pads as shown in FIG. 3, such measurement can be continued in turn for the rest of the wiring pads, thereby checking connecting condition of the path.

It should be appreciated that, in the example shown herein, an arbitrary pair of wiring pads C can be selectively connected to the monitoring terminal Ttest by means of the switching means 231–235 provided on the second IC chip 220, and that the resistance between the associated wiring pads can be measured externally using the external terminals Tvdd-u and Tgnd-u connected directly to the power supply pad, which enables post-packaging connection tests of the products and removal of defective ones, thereby improving the quality of the products.

It is an important feature of the invention that in carrying out the second example the first IC chip 210 does not require any additional element or modification if it is of conventional type.

Nevertheless, through such an external measurement as describe above, connecting conditions of individual wiring pads can be adequately evaluated.

Variability in voltage and the reversibility in polarity of the power supply for measurement allows very accurate measurements as contrasted to conventional measurements.

Figure 5:
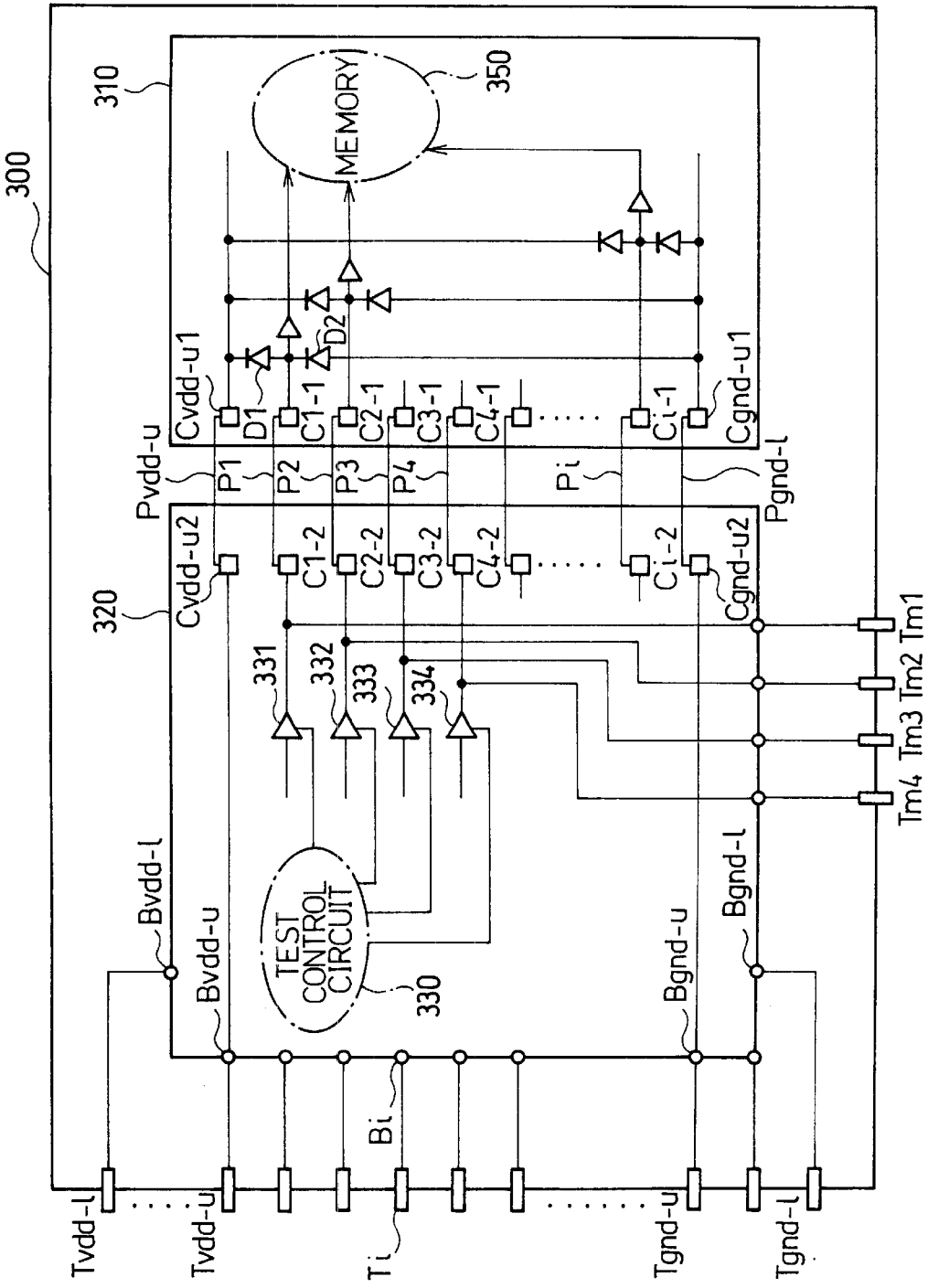
FIG. 5 is a block diagram of a third semiconductor device of the invention.
Figure 6:
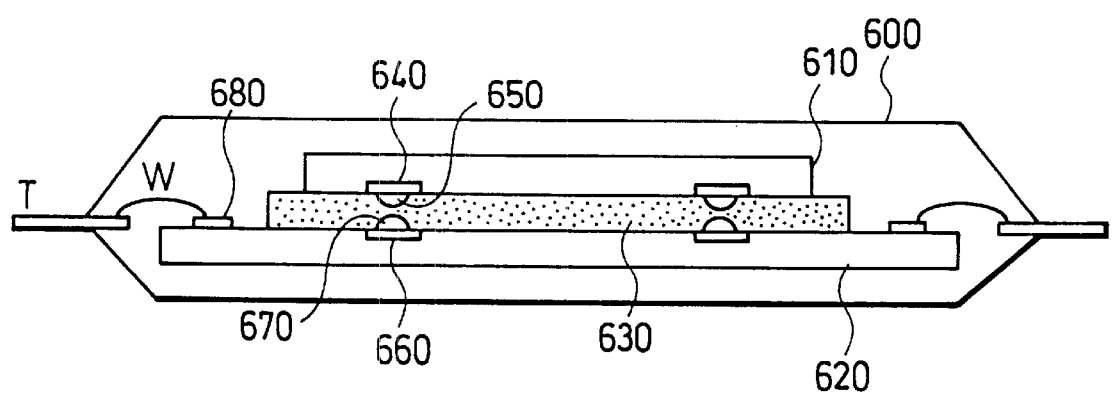
FIG. 6 is a block diagram of a conventional multi-layered integrated semiconductor device.

FIG. 5 is a schematic representation of a third example of the invention, showing the structure thereof in development for ease of understanding of the invention.

Referring to FIG. 5 a first semiconductor IC chip 310 is a general purpose IC chip, (such as a memory IC having a memory device 350) which effectively utilizes electrostatic protection diodes D1 and D2 as in the second example. Each of wiring pads C1-1–C4-1 is connected to a positive voltage source via a diode D1 and to a negative voltage source via a diode D2. These diodes D1 and D2 are capable of suppressing an anomalous voltage surge appearing at the I/O wiring pads by causing the power line to absorb the voltage surge, thereby minimizing the influence thereof to the internal elements.

On the other hand, the second IC chip 320 is provided with a power supply pad Cvdd-u2 and a grounding pad Cgnd-u2 in opposition to a power supply pad Cvdd-u1 and a grounding pad Cgnd-u1, respectively, of the first IC chip 310, in addition to ordinary wiring pads formed in opposition to the corresponding wiring pads of the first IC chip 310. The power supply pad Cvdd-u2 is connected to an external terminal Tvdd-u via an external wiring pad Bvdd-u of the second IC chip 320. The grounding pad Cgnd-u2 is connected to an external terminal Tgnd-u via an external wiring pad Bgnd-u of the second IC chip 320.

A power line of the second IC chip 320 is connected to an external terminal Tvdd-1 via an external wiring pad Bvdd-1, and to an external terminal Tgnd-1 via an external connection pad Bgnd-1. That is, the power line and the ground line of the first IC chip 310 are formed independent of the power line and the ground line of the second IC chip 320.

Connected with the wiring pads C1-2–C4-2 are buffer circuits 331–334 and testing terminals Tm1–Tm4 for connection with the first IC chip 310. When a test instruction is received from a test control circuit 330, the buffer circuits 331–334 are disconnected.

The four testing terminals Tm1–Tm4 are connected to the respective four-cornered wiring pads C1-2–C4-2 of the second IC chip 320, which are located in opposition to the four-cornered wiring pads of the first semiconductor IC chip 310.

The first IC chip 310, aligned with the second IC chip 320, is overlaid on an isotropic conductive layer placed on the second IC chip 320. When the sandwiched conductive layer is thermocompressed, it becomes electrically conductive, thereby connecting the corresponding wiring pads of the first and the second IC chips. For example, the wiring pads C1-1 and C1-2 are electrically connected with each other by a section P1 of the anisotropic conductive layer, while the power supply pads Cvdd-u1 and Cvdd-u2 are electrically connected with each other by a section Pvdd-u of the anisotropic conductive layer. Similar connections are formed between other corresponding wiring pads.

Electric connections of the wiring pads of the integrated semiconductor device 300 thus assembled are tested and confirmed as follows.

First, the test control circuit 330 is controlled so as to turn off the buffer circuits 331–334. In cases where the second IC chip 320 is disconnected from the power supply, the buffer circuits 331–334 are turned off.

A variable voltage power supply is then connected between one of the test terminals Tm1–Tm4 associated with the wiring pad to be tested and either the power supply terminal Tvdd-u or the grounding terminal Tgnd-1. The current passing through the loop is measured. Circuits thus established and the procedure for the measurement are practically the same as for the second example in conjunction with FIGS. 3 and 4, so that details of the measurements will not be repeated here.

It should be understood, however, that the third example differs greatly from the second example in that no analog switch is involved in any of the measurement loops. If there were an analog switch in the loop as in the second example, it would inevitably induce some impedance's, which would obscure the relevant pad-to-pad resistance. The third example is free of such obscurity.

It is noted that, in the third example, the measurement is performed using the four-cornered wiring pads. It is theoretically possible to provide as many external test terminals as needed for the wiring pads. However, an optimum compromise between a structural simplicity of the semiconductor IC device and the merits of such complex terminal arrangement would be provision of the four cornered test terminals.

In the third example, an arbitrary pad-to-pad resistance between a relevant wiring pad of the first IC chip 310 and the associated pad of the second IC chip 320 can be measured externally using four-cornered (or alternatively four-sided) monitoring terminals Tm1–Tm4 connected to similarly four-cornered wiring pads and external terminals Tvvd-u and Tgnd-u which are directly connected with the power supply pad and the grounding pad, respectively. Thus, the invention is suited for post-packaging connection tests of the multi-layered integrated IC devices and removal of defective ones, thereby improving the quality of the products.

It is an important feature of the invention that in carrying out the third example the first IC chip 310 does not require any additional element or modification if it is of conventional type.

In addition, direct and individual measurements of the pad-to-pad resistances can be made for the relevant wiring pads without using analog switches but using external terminals, thereby providing more accurate results in the measurements.

Further use of a voltage-variable and/or polarity-reversible power source will add accuracy to the measurements.

What we claim is:

1. A multi-layered integrated semiconductor device comprising:
    first and second IC chips each having a plurality of wiring pads, the first and second IC chips being disposed substantially parallel to a plane and at least partially overlapping when viewed in a direction perpendicular to the plane, each of the plurality of wiring pads of the first IC chip at least partially overlapping with a corresponding one of the plurality of wiring pads of the second IC chip when viewed in the direction perpendicular to the plane;
    a first set of distributed monitoring pads formed on said first IC chip, said moitoring pads connected pairs;
    a second set of monitoring pads each formed on the second IC chip and at least partially overlapping with a corresponding one of said first monitoring pads when viewed in the direction perpendicular to the plane; and
    a multiplicity of external monitoring terminals each formed on said semiconductor device and connected to an associated one of said second monitoring pads,
    thereby allowing measurements of pad-to-pad resistances between corresponding monitoring pads of said first and second IC chips using an associated pair of said external monitoring terminals connected to said corresponding pads.

2. The integrated semiconductor device according to claim 1, wherein said first monitoring pads are located around a periphery of said first IC chip.

3. The integrated semiconductor device according to claim 1, wherein first monitoring pads are located at four corners of said first IC chip.

4. The integrated semiconductor device according to claim 1, wherein one connected pair of said first monitoring pads serves as a terminal pad of said first IC chip.

5. A multi-layered integrated semiconductor device incorporating a first and a second IC chip which are connected with each other, said integrated semiconductor device comprising:
    a first power supply pad formed on said first IC chip and connected to a power supply line;
    a first grounding pad formed on said first IC chip and connected to a ground line;
    a first set of wiring pads formed on said first IC chip and connected via diodes to said power supply line and ground line and said first IC chip;
    a second power supply pad formed on said second IC chip in opposition to said first power supply pad;
    a second grounding pad formed on said second IC chip in opposition to said first grounding pad;
    a second set of wiring pads formed on said second IC chip, in opposition to the respective wiring pads of said first IC chip;
    a multiplicity of switchable connection circuits formed on said second IC chip for selectively connecting said second wiring pads to either said second IC chip or an external test signal line;
    an external power supply pad connected to said second power supply pad;
    an external grounding terminal connected to said second grounding pad; and
    a multiplicity of external test terminals connectable to said external test signal line,
    thereby allowing measurements of pad-to-pad resistances between the wiring pads of the first and the second IC chips using said external test terminals, power supply terminal, and grounding terminal.

6. The multi-layered integrated semiconductor device according to claim 5, further comprising a test control circuit formed on said second IC chip for controlling said switchable connection circuits in response to an external control signal received via said test terminal, to thereby disconnecting said second IC chip from said wiring pads and simultaneously selectively connecting said test signal line to one of said second wiring pads.

7. The multi-layered integrated semiconductor device according to claim 6, wherein each of said switchable connection circuits consists of a buffer circuit for connecting said second wiring pads to said second IC chip, and of a switching circuit for selectively connecting said second wiring pads to said test signal line.

8. A multi-layered integrated semiconductor device incorporating a first and a second IC chips which are connected with each other, said integrated semiconductor device comprising:
    a first power supply pad formed on said first IC chip and connected to a power supply line;

a first grounding pad formed on said first IC chip and connected to a ground line;

a first set of wiring pads formed on said first IC chip and connected via diodes to said power supply line and ground line and said first IC chip;

a second power supply pad formed on said second IC chip in opposition to said first power supply pad;

a second grounding pad formed on said second IC chip in opposition to said first grounding pad;

a second set of wiring pads formed on said second IC chip, in opposition to the respective wiring pads of said first IC chip;

a multiplicity of buffer circuits formed on said second IC chip for selectively connecting to/disconnecting from said second IC chip said second wiring pads;

an external power supply terminal connected to said second power supply pad;

an external grounding terminal connected to said second grounding pad; and a multiplicity of external test terminals connectable to said second wiring pads, thereby allowing measurements of pad-to-pad resistances between the wiring pads of the first and the second IC chips using said external test terminals, power supply terminal, and grounding terminal.

9. The multi-layered integrated semiconductor device according to claim 8, further comprising a test control circuit for controlling said buffer circuit to connect to/disconnect from said second IC chip said second wiring pads.

* * * * *